United States Patent [19]

Pool

[11] 4,038,569
[45] July 26, 1977

[54] BISTABLE CIRCUIT

[75] Inventor: Ferdinand Pool, Beekbergen, Netherlands

[73] Assignee: U.S. Philips Corporation, New York, N.Y.

[21] Appl. No.: 607,772

[22] Filed: Aug. 26, 1975

[30] Foreign Application Priority Data

Sept. 2, 1974 Netherlands .................. 7411604

[51] Int. Cl.$^2$ ........................................... H03K 3/286
[52] U.S. Cl. ................................... 307/289; 307/291; 328/206
[58] Field of Search ............... 307/219, 289, 291, 292; 328/206

[56] References Cited

U.S. PATENT DOCUMENTS 3,317,750 5/1967 Narud et al. .................. 307/291

*Primary Examiner*—John Zazworsky
*Attorney, Agent, or Firm*—Frank R. Trifari; Bernard Franzblau

[57] ABSTRACT

A bistable circuit comprises two sets of transistors with the emitter electrodes and collector electrodes of each set being interconnected. First like interconnected electrodes of each set are connected to a first supply terminal by separate first and second resistors having a comparatively small value. Second like interconnected electrodes of each set of transistors are connected to a second supply terminal by a common third resistor having a comparatively high value. Furthermore, one control electrode of each set is cross-wise connected to the first like interconnected electrodes of the other set. A further control electrode of each set is connected to an output of a logic circuit having built-in redundancy. The separate outputs of the bistable circuit are furthermore connected to the control electrodes of a further pair of transistors, first further electrodes thereof being connected, by a common resistor, to the second supply terminal, further second electrodes thereof being connected to the first supply terminal by separate resistors. A single one of the latter further electrodes constitutes an output of the circuit. If both outputs of the logic circuit supply a control signal whereby one transistor of each set of transistors becomes conducting, a signal having a value between the two stable signal values of the bistable circuit appears at the output. Inspite of the redundancy, the logic circuit can thus be completely tested.

9 Claims, 4 Drawing Figures

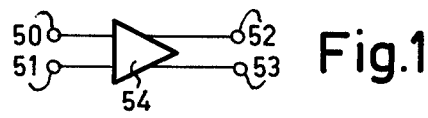
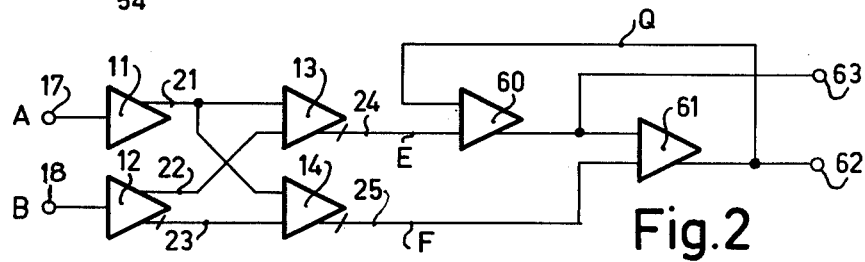
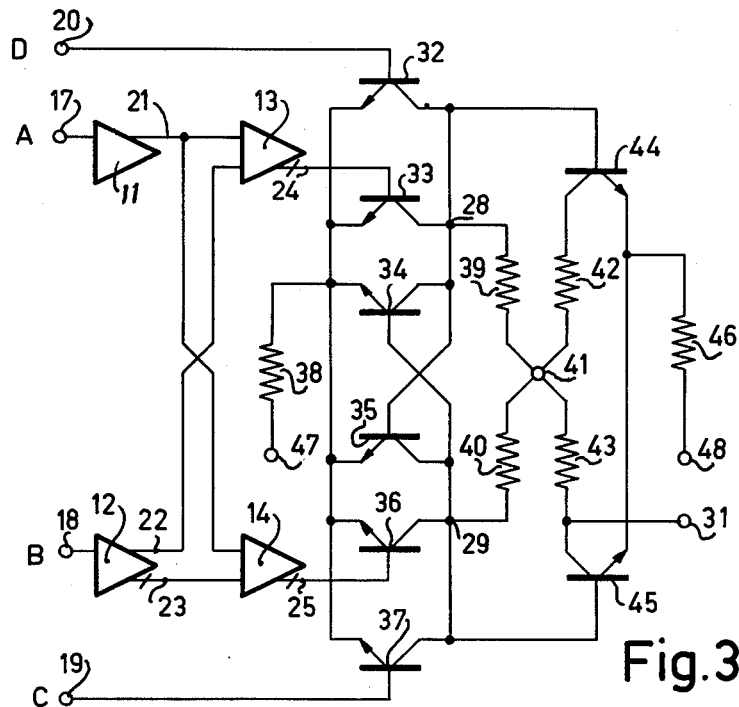
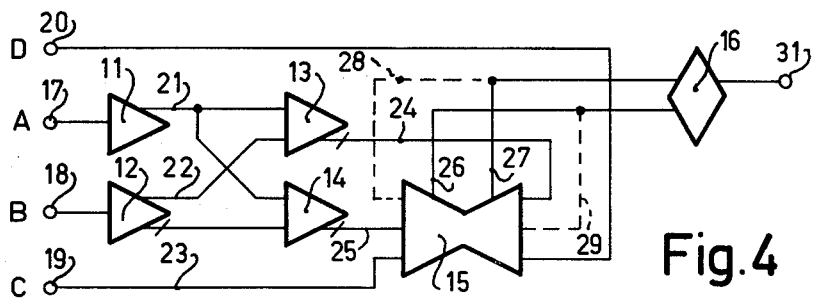

BISTABLE CIRCUIT

The invention relates to a bistable circuit comprising a first set and a second set of transistors, the emitter electrodes and collector electrodes of each set being interconnected, first like interconnected electrodes being each time connected to a first supply terminal by a separate first resistor, and second like interconnected electrodes being connected to a second supply terminal by a second resistor in a current source circuit which is common to both sets, per set each time at least one control electrode being cross-wise coupled to the said first like interconnected electrodes of the other set, at least one further control electrode of each set being connected to an output of an additional combinatory logic circuit. Bistable circits are widely used. Notably in extensive circuits comprising many logic circuit elements a problem exists in that, due to tolerances in switching times of the circuit elements, the logic result of an operation can be influenced by temporary, logically unjustified conditions which are known as hazards or critical race conditions. With respect to a single circuit element, these conditions can at an output occur nonpermanently or permanently, the latter of course being possible only in sequential logic circuits. It is known that such temporary, unjustified conditions can remain without effect when given logic additions are made to a circuit. Such additions may consist of an additional gate function or an additional logic feedback loop. Notably in integrated circuits, however, a problem then exists in that part of the function may be lost due to a variety of defects. It was found to be very difficult to detect whether the safeguard against the effects of temporary, unjustified conditions is still present, because these unjustified conditions themselves then have to be detected.

The invention utilises a different approach, which is possible in that notably the said second resistor is included in a current source circuit. A current source circuit is a circuit having such a high output resistance that the current supplied by the circuit is almost completely determined by the circuit itself and the output resistance (i.e. for all practical purposes it is not determined by the load). Notably the values of the said first resistors are small with respect to the said second resistors. The invention offers a circuit wherein the bistable section does not require any additional logic additions against the effects of temporary, unjustified logic conditions which could appear in the said additional combinatory logic circuit. The invention provides a bistable circuit having a built-in facility for performing a test as regards the presence of all necessary connections, including the redundant connections, in the additional combinatory logic circuit. The invention provides a bistable circuit wherefrom three different continuous signals can be derived, one signal being a test signal. The invention offers a circuit having two stable, self-sustaining logic conditions as well as at least one third, combinatory intermediate condition. The intermediate condition and the test signal appear exclusively if a defect is present in the combinatory logic circuit.

The objects according to the invention are achieved in that a built-in redundance of the combinatory logic circit can be tested because, under the control of coexistent signals on the said further control electrodes, both sets of transistors can be made conducting together, with the result that the said first resistors, having a resistance which is small with respect to the said second resistor, carry substantially equal currents, so that an output signal of the bistable circuit has a stationary intermediate value. The first and the second, respectively, set of transistors can thus be made conductive by suitable signals on the control electrodes thereof so that the said first resistors are connected in parallel when conducting current. On the same outputs a test voltage is present which lies between the two values assumed if only one of the two first-resistors conducts current. The two first resistors preferably have the same value so that the test voltage lies halfway between the two hold conditions and proper discrimination is obtained. The said coexistent signals can appear exclusively if the said built-in redundancy is broken by a defect.

Outputs present between the said separate first resistors and the said interconnected electrodes are preferably connected to control electrodes of further transistors, each time a first further electrode thereof being connecteed, by a separate resistor, to the first supply terminal, a second further electrode thereof being connected to the second supply terminal by a resistor which is common to the further transistors. This results in an attractive, linearly operating output circuit for the bistable circuit. Using such a circuit, the test signal can be applied to an output also if the output (outputs) of the circuit is (are) connected to inputs of further logic circuits. The three possible conditions can thus be readily discriminated.

A further control electrode of the said first and second set of transistors is each time preferably connected to a further input terminal of the circuit. The possibilities for use of the circuit are thus increased.

A single first further electrode of the said further transistors is preferably connected to an output terminal of the circuit. It is thus sufficient to use only a single output of the integrated circuit. This is advantageous in view of the general aim to reduce the number of these outputs.

The invention will be described in detail hereinafter with the reference to the accompanying drawing in which:

FIG. 1 symbolically shows a logic gate which is universally used in the description.

FIG. 2 shows a diagram of a circuit wherein the objects of the invention are not realized.

FIG. 3 shows a circuit according to the invention in which the individual transistors are shown.

FIG. 4 shows the same circuit using a more symbolic notation.

FIG. 1 shows a symbolic notation for a logic gate 54 having an AND/NAND-function. The gate comprises two inputs 50, 51 and two outputs 52, 53. If a logic 1-signal is present on both the inputs 50 and 51, output 52 also carries a logic 1-signal (AND-function). In all other cases the output 52 carries a logic 0-signal. The output 53 always carries an inverted signal with respect to output 52. This logic NAND-function is denoted by a lateral stroke. A number of the connections 50 . . . 53 can be omitted. For example, if connections 51 and 53 are omitted, the circuit operates as an amplifier. If connections 51 and 52 are omitted, the circuit operates as an invertor.

FIG. 2 shows a circuit wherein the objects of the invention are not realized. The circuit comprises six logic gates 11, 12, 13, 14, 60, 61 according to the principle shown in FIG. 1, two inputs 17, 18, two outputs 62, 63, and further the lines 21, 22, 23, 24, 25. On output 62 the signal Q is present and on line 24 the signal E and on line 25 the signal F is present. Therefore, on terminal 63 the signal $\overline{E.Q}$ is present. Consequently, the signal $\overline{\overline{E.Q}\cdot\overline{F}} = E.Q + F = Q$ is present on terminal 62. The dot indicates a logic AND-function, the plus sign indicates the logic OR-function, and the horizontal stroke indicates the inverted value of the variable. The combinatory circuit, consiting of the gates 11, 12, 13, 14 according to FIG. 1, has the following function: on terminal 17 the input signal A is present and on terminal 18 the input signal B is present. The gate 11 operates as an amplifier. Consequently, the signal A is present on line 21. The gate 12 acts as an amplifier (line 22) and as an inverter (line 23). The gates 13, 14 act as logic NAND-gates. Consequently, on line 22 the signal $\overline{B}$ is present, on line 24 the signal $\overline{A.B} = \overline{A} + \overline{B}$ is present. Consequently, on line 25 the signal $\overline{A.\overline{B}} = \overline{A} + B$ is present. Therefore, for the complete circuit: $Q = E.Q + F = (\overline{A} + \overline{B}).Q + A.\overline{B} = \overline{A.B}.Q + A.\overline{B}$.

The bistable circuit is a so-termed data flipflop, the input B being the data input. If the signal A is logic 0, the hold condition is realized. If the signal A is logic 1, the equation is reduced to:

$$Q = \overline{B}.Q + B$$

In that case Q assumes the inverted value of B. It will be obvious that in the latter case one of the two terms B is redundant. In FIG. 2 this means that one of the connections from the gate 12 to the gates 13 and 14 is redundant, and hence has no effect on the static phenomena.

This is not applicable to the dynamic phenomena. Assume that line 23 has been omitted, and that on line 22 a logic 1-signal is present. If the signal on line 21 changes, both signals on the lines 24 and 25 change. As a result, both terms in the now applicable expression for Q:

$$Q = \overline{A}.Q + A.\overline{B}$$

may change in an opposite sense so that in given cases the output 62 is liable to supply an unjustified logic signal for a brief period of time. If both connections 22, 23 are present, however, this phenomenon does not occur.

The circuit can be tested for the presence of redundant connections as follows: signal A is made to be logic 1 and so is signal B. If line 23 is interrupted, the signals E and F are both zero. As a result, a logic 1 is present on both outputs 62, 63: this indicates an error. The presence of line 22 is tested by making the signal A logic 1 and by making the signal B logic 0. Interruption then also causes the same logic signals on outputs 62, 63. If only one output is present the bistable circuit cannot be tested. The necessity of having two outputs is very annoying: it is a known aim to minimize the number of connections.

FIG. 3 shows a circuit according to the invention. In addition to a combinatory logic circuit which is identical to that of FIG. 2, FIG. 3 shows two further input terminals 19, 20, eight transistors 32, 33, 34, 35, 36, 37, 44, 45, six resistrs 38, 39, 40, 42, 43, 46, one output terminal 31, and supply terminals 41, 47, 48. Also shown are the lines 28 and 29.

The supply terminal 41 is connected to a voltage source of 0 volts, the supply terminals 47, 48 being connected to a voltage source of −2 volts. The transistors 32, 33, 34 and 35, 36, 37 each form a set, the emitter electrodes and collector electrodes being interconnected in each set. The base electrodes of the transistors 34 and 35 are cross-wise connected to the interconnected collector electrodes of the other set of transistors. Assume that the transistors 32, 33, 36 and 37 are cut off and that the transistor 34 is conducting. As a result, the line 28 is at a comparatively low potential, and so is the base electrode of the transistor 35. As a result, the transistor 35 is cut off and the line 29 is at a comparatively high potential, as is the base electrode of the transistor 34. This is in agreement with the conductive condition of the transistor 34. If a high signal on the base electrode of the transistor 32 or 33 causes this transistor to become temporarily conducting, the circuit does not experience any permanent consequences. If a high signal on the base electrode of the transistor 36 or 37 causes this transistor to become temporarily conducting, the base electrode potential of the transistor 34 drops to a low value so that this transistor is cut off. As a result, the base electrode of the transistor 35 assumes a comparatively high potential so that this transistor changes over to the conducting state. This changed state is maintained when the transistors 36 and 37 are both cut off again when the high signal on their bases terminates. Two stable states are thus defined.

The resistors 39, 40 have, for example, the same value in the range between 30 and 300 ohms. The value of the resistor 38 is, for example, 6 times as high. If one of the transistors 34, 35 is conducting, and the resistors 39/40 and 38 have the values 100 and 600 ohms, respectively, the current is approximately 1.72 mA, taking into account a voltage drop of approximately 0.8 volts across the base-emitter electrode junction of the conducting transistor. If the transistor 34 is conducting, the potential of the line 29 is approximately 0 volts. If the transistor 35 is conducting, the potential of the line 29 is approximately −172 mV.

The combinatory circuit (gates 11 ... 14) has already been described. As has already been stated, known combinatory circuits having a built-in redundancy do not supply unjustified, brief logic signals. The reverse does not occur as a rule because usually the said redundancy does not have a noticeable effect on the output signal. The hazards become noticeable only if given tolerances are exceeded. This can occur, for example, in a very specific temperature range or only in the case of a given disturbance of the prescribed waveform. Other causes may also be involved, possibly even a specific information status of adjoining logic circuit components in combination with one or more of the above causes. If the tolerances are not exceeded, the hazards do not occur, not even if the redundancy has been disturbed. The latter can be the case due to an interrupted connection or, in the case of an integrated circuit, due to one of the many manufacturing defects liable to occur therein. The composition of the combinatory logic circuit consisting of the gates 11 ... 14 and the bistable circuit consisting of the transistors 32 ... 37, enables the combinatory circuit to be tested as regards the presence of the redundant connection between the gates 12 and 13/14. The bistable circuit performs, like the circuit shown in FIG. 2, the function of a single data flipflop (D-latch). Known data flipflops have only two stable states. According to the invention, the combination of a redundant combinatory circuit and a bistable circuit allows the redundancy of the former to be tested. This is effected in that, in the case of a disruption of the redundancy, a stationary intermediate state can be produced wherein both transistors 33, 36 become conducting under the control of a logic 0 on the output of the gates 13, 14. This 0 appears if the signal A is logic 1 and the connection between gate 12 and one of the gates 13, 14 is also logic 1 (the other connection is assumed to be interrupted). Both lines 24, 25 then carry a logic 0, which implies a high signal level for the negative logic used here. As a result, both transistors 33, 36 become conducting. Consequently, the resistors 39, 40 conduct current in parallel. The potential of the lines 28, 29 becomes approximately −86 mV for the substantially constant current through resistor 38. This voltage can be properly detected.

The transistors 44, 45 form a linear output stage. The emitter electrodes are connected, via a common resistor 46 of, for example, 300 ohms, to a voltage source of −2 volts. The collector electrodes are connected, via separate resistors 42, 43 of, for example, 50 ohms, to the supply terminal 41. Besides the two stable voltage states, in the absence of a redundant connection, an intermediate state can also be derived from the output terminal 31, so that a defect can be detected. In accordance with FIG. 2, two measurements must be performed for detecting the interruption. The intermediate state can also be detected on terminal 31 if this terminal is also connected to the inputs of further gate circuits, for example, a further gate circuit as shown in FIG. 3 The further input terminals 19, 20 also provide an extension, so that the circuit of FIG. 3 can also be used as an SR flipflop. A high signal on the terminal 19 or 20 makes the transistor 37 or 32, respectively, conducting, and hence brings the transistor 35 or 34, respectively, into the hold state.

FIG. 4 shows a more symbolic notation of FIG. 3. The lines are analogously numbered. The bistable circuit (transistors 32 . . . 37) is shown as a single element 15 comprising four external inputs 19, 25, 20, 24 and two feedback loops 28, 29 which are denoted by broken lines. The latter loops thus correspond to the cross-wise coupled lines to the control electrodes of the transistors 34, 35 in FIG. 3. The output stage of FIG. 3 (transistors 44, 45) is now shown as a single element 16 comprising a single output.

Obviously, the idea of the invention is neither restricted to the described combinatory circuit nor to the given resistances. According to the invention, however, redundancy can be tested in that a combinatory and a sequential circuit are combined in a specific manner.

What is claimed is:

1. In combination, a bistable circuit and a logic circuit, the bistable circuit comprising, a first set of transistors having their emitter electrodes interconnected and their collector electrodes interconnected, a second set of transistors having their emitter electrodes interconnected and their collector electrodes interconnected, means connecting first corresponding interconnected electrodes of said first and second sets of transistors to a first supply terminal via respective separate first and second resistors, means connecting second corresponding interconnected electrodes of said first and second sets of transistors to a second supply terminal via a common third resistor in a current source circuit which is common to both sets of transistors, said third resistor having a higher resistance value than said first and second resistors, one control electrode of each set of transistors being cross-wise coupled to said first corresponding interconnected electrodes of the other set, said logic circuit comprising at least two input terminals and two output terminals and internal logic means for generating a redundant logic signal, means connecting at least one further control electrode of each set of transistors to a respective output of said logic circuit, the redundancy of the logic circuit being testable under the control of co-existent signals applied to said further control electrodes whereby at least one transistor of each set of transistors can be made to conduct together so that said first and second resistors carry substantially equal currents in parallel.

2. A combination as claimed in claim 1 further comprising, means connecting said interconnected first electrodes to control electrodes of first and second further transistors, means connecting a first further electrode of each of said first and second further transistors via a separate resistor to the first supply terminal, and means connecting a second further electrode of each of said first and second further transistors to the second supply terminal via a resistor which is common to the further transistors.

3. A combination as claimed in claim 1 further comprising means connecting a further control electrode of said first and second sets of transistors to further respective input terminals of the circuit.

4. A combination as claimed in claim 2 further comprising, means connecting a single first further electrode of said further transistors to an output terminal of the bistable circuit.

5. A combination as claimed in claim 2 further comprising means connecting a further control electrode of each of said first and second sets of transistors to respective further input terminals of the bistable circuit.

6. A combination as claimed in claim 1 wherein said first and second resistors have substantially equal values of resistance.

7. A combination as claimed in claim 1 wherein the logic circuit further comprises a first plurality of logic gates for generating binary intermediate signals in response to bianry input signals received at the two input terminals of the logic circuit, and a second plurality of logic gates responsive to said binary intermediate signals for supplying at least two binary output signals at the two output terminals of the logic circuit, and wherein said internal logic means comprises a redundant connection between the output of one gate of said first plurality of gates and the input to one gate of said second plurality of gates.

8. A combination as claimed in claim 1 wherein said one cross-wise coupled control electrode of each set of transistors is directly connected to the interconnected electrodes of the other set of transistors.

9. A combination as claimed in claim 8 wherein each set of transistors includes at least three transistors with their emitter electrodes directly connected together and their collector electrodes directly connected together, said one cross-wise coupled control electrode is the base electrode of a first transistor of each set of transistors, said one further control electrode is the base electrode of a second transistor of each set of transistors, and wherein the base electrodes of the third transistors of each set of transistors is individually coupled to further input terminals of the bistable circuit.

* * * * *